(12) United States Patent
Sinha

(10) Patent No.: US 8,084,683 B2
(45) Date of Patent: Dec. 27, 2011

(54) LOW-COST MULTI-JUNCTION SOLAR CELLS AND METHODS FOR THEIR PRODUCTION

(76) Inventor: Ashok Sinha, Los Altos Hill, CA (US)

( * ) Notice: Subject to any disclaimer, the term of this patent is extended or adjusted under 35 U.S.C. 154(b) by 0 days.

(21) Appl. No.: 13/107,875

(22) Filed: May 14, 2011

(65) Prior Publication Data
US 2011/0220201 A1 Sep. 15, 2011

Related U.S. Application Data

(60) Division of application No. 12/629,049, filed on Dec. 2, 2009, now Pat. No. 7,951,640, which is a continuation-in-part of application No. 12/267,530, filed on Nov. 7, 2008, now Pat. No. 7,960,644.

(51) Int. Cl.
*H01L 31/00* (2006.01)
*H01L 21/00* (2006.01)
(52) U.S. Cl. .......................... 136/258; 438/96
(58) Field of Classification Search .................. 136/258; 438/96, 460; 257/E21.211, E21.09, E31.057
See application file for complete search history.

(56) References Cited

U.S. PATENT DOCUMENTS

| | | | |
|---|---|---|---|
| 3,961,997 A | 6/1976 | Chu | |
| 3,969,163 A | 7/1976 | Wakefield | |
| 4,077,818 A | 3/1978 | Chu | |
| 4,084,024 A | 4/1978 | Schumacher | |
| 4,124,410 A * | 11/1978 | Kotval et al. | 136/258 |
| 4,270,018 A | 5/1981 | Gibbons | |
| 4,450,316 A | 5/1984 | Hamakawa | |
| 4,528,062 A | 7/1985 | Moustakas | |
| 4,668,840 A | 5/1987 | Kiyama | |
| 4,755,475 A | 7/1988 | Kiyama | |
| 4,818,337 A | 4/1989 | Barnet | |

(Continued)

FOREIGN PATENT DOCUMENTS
EP 1460693 9/2004

OTHER PUBLICATIONS

Understanding and Implementation of Hydrogen Passivation of Defects in String Ribbon Silicon for High-Efficiency, Manufacturable, Silicon Solar Cells; Vijay Yelundur PhD Thesis at GeorgiaTech; Nov. 2003.

(Continued)

*Primary Examiner* — Basia Ridley
*Assistant Examiner* — Tamir Ayad
(74) *Attorney, Agent, or Firm* — Joseph Bach

(57) ABSTRACT

Solar cells fabricated without gasification of metallurgical-grade silicon. The substrates are prepared by: melting metallurgical grade silicon in a furnace; solidifying the melted metallurgical grade silicon into an ingot; slicing the ingot to obtain a plurality of wafers; polishing and cleaning each wafer; depositing aluminum layer on backside of each wafer; depositing a layer of hydrogenated silicon nitride on front surface of each wafer; annealing the wafers at elevated temperature; removing the hydrogenated silicon nitride; and, removing the aluminum layer. The front surface may be textured prior to forming the solar cell. The solar cell structure comprises a metallurgical grade doped silicon substrate and a thin-film structure formed over the substrate to form a p-i-n junction with the substrate. The substrate may be doped p-type, and the thin film structure may be an intrinsic amorphous layer formed over the substrate and an n-type amorphous layer formed over the intrinsic layer.

9 Claims, 11 Drawing Sheets

U.S. PATENT DOCUMENTS

| | | | |
|---|---|---|---|
| 4,981,525 | A | 1/1991 | Kiyama |
| 5,066,340 | A | 11/1991 | Iwamoto |
| 5,114,498 | A | 5/1992 | Okamoto |
| 5,155,051 | A | 10/1992 | Noguchi |
| 5,213,628 | A | 5/1993 | Noguchi |
| 5,370,747 | A | 12/1994 | Noguchi et al. |
| 5,401,331 | A | 3/1995 | Ciszek |
| 5,401,336 | A | 3/1995 | Noguchi |
| 5,455,430 | A | 10/1995 | Noguchi |
| 5,538,902 | A | 7/1996 | Izu |
| 5,549,763 | A | 8/1996 | Sano |
| 5,584,941 | A | 12/1996 | Nishida |
| 5,614,785 | A | 3/1997 | Wallace |
| 5,639,314 | A | 6/1997 | Kura |
| 5,693,957 | A | 12/1997 | Sano |
| 5,705,828 | A | 1/1998 | Noguchi |
| 5,907,766 | A | 5/1999 | Swanson |
| 5,935,344 | A | 8/1999 | Endo |
| 5,951,785 | A | 9/1999 | Uchihashi |
| 6,060,400 | A | 5/2000 | Oehrlein |
| 6,063,654 | A | 5/2000 | Ohtani |
| 6,100,166 | A | 8/2000 | Sakaguchi |
| 6,175,512 | B1 | 1/2001 | Hagihara |
| 6,207,890 | B1 | 3/2001 | Nakai |
| 6,252,785 | B1 | 6/2001 | Hagihara |
| 6,342,669 | B1 | 1/2002 | Sakai |
| 6,380,479 | B2 | 4/2002 | Nakai |
| 6,384,316 | B1 | 5/2002 | Shinohara |
| 6,402,974 | B1 | 6/2002 | Trevor |
| 6,410,843 | B1 | 6/2002 | Kishi |
| 6,465,727 | B2 | 10/2002 | Maruyama |
| 6,521,883 | B2 | 2/2003 | Isomura |
| 6,667,434 | B2 | 12/2003 | Morizane |
| 6,749,685 | B2 | 6/2004 | Coleman |
| 6,849,917 | B2 | 2/2005 | Maruyama |
| 6,878,921 | B2 | 4/2005 | Taguchi |
| 7,030,413 | B2 | 4/2006 | Nakamura |
| 7,164,150 | B2 | 1/2007 | Terakawa |
| 7,781,669 | B2 | 8/2010 | Terakawa |
| 7,863,518 | B2 | 1/2011 | Terakawa |
| 2002/0175143 | A1 | 11/2002 | Cooooper |
| 2003/0203547 | A1 | 10/2003 | Sakaguchi |
| 2007/0166219 | A1 | 7/2007 | Arimoto |
| 2008/0121280 | A1 | 5/2008 | Carnel |

OTHER PUBLICATIONS 20.7% Highest Efficiency Large Area (100.5cm2) HIT Cell; Hitoshi Sakata, Takuo Nakai, Toshiaki Baba, Mikio Taguchi, Photovoltaic Specialists Conference, 2000. Conference Record of the Twenty-Eighth IEEE 2000.

Silicon-Film Photovoltaic Manufacuring Technology, Final Technical Status Report Jan. 1, 1992-Jul. 31, 1995.Sandra R. Collins, Robert B. Hall, and James A. Rand, National Renewable Energy Laboratory.

Comparative Study of Rapid and Classical Thermal Phosphorus Diffusion on Polycrystalline Silicon This Films, S. Bourdais et al., Solar Energy Materials and Solar Cells, 65, pp. 487-493, 2001.

Development of an Emitter for Industrial Silicon Solar Cells Using the Doped Oxide Solid Source Diffusion Technique, R. Chaoui, et al., Renewable Energy, 23, pp. 417-428, 2001.

Tan, J. et al., "On the Electronic Improvement of Multi-Crystalline Silicon via Gettering and Hydrogenation" Published online Sep. 5, 2007 in Wiley InterScience, John Wiley & Sons Ltd., pp. 129-134.

Lu Majun et al., "Interdigitated Back Contact Silicon Heterojunction (IBC-SHJ) Solar Cell" 2007, Materials Research Society Symposium Proceedings, vol. 969, 0989-A24-05, pp. 1-6.

Yelundur, V. et al., "AI-enhanced PEVCD SiNx Induced Hydrogen Passivation in String Ribbon Silicon" Jan. 2001, Journal of Electronic Materials, vol. 30, No. 5, pp. 526-531.

Green Martin A., "High-Efficiency Silicon Solar Cells" May 1984, IEEE Transactions on Electron Devices, vol. ED 31, No. 5, pp. 679-683.

Sawada, Toru et al., "High Efficiency a-Si/c-Si Heterojunction Solar Cell" 1994 IEEE CH3365-4/94/0000-1219, pp. 1219-2126.

\* cited by examiner

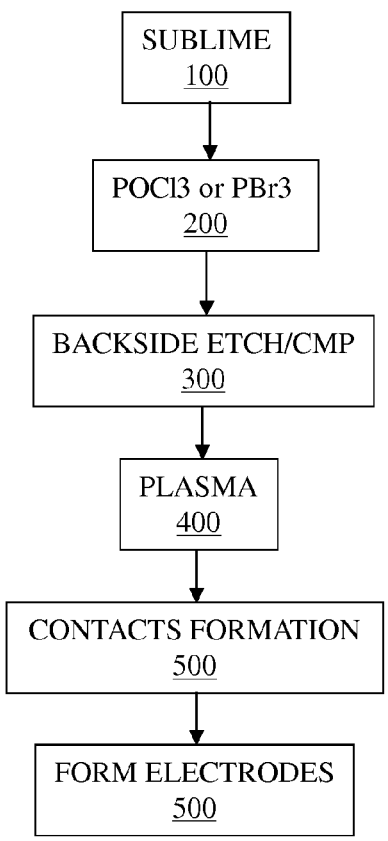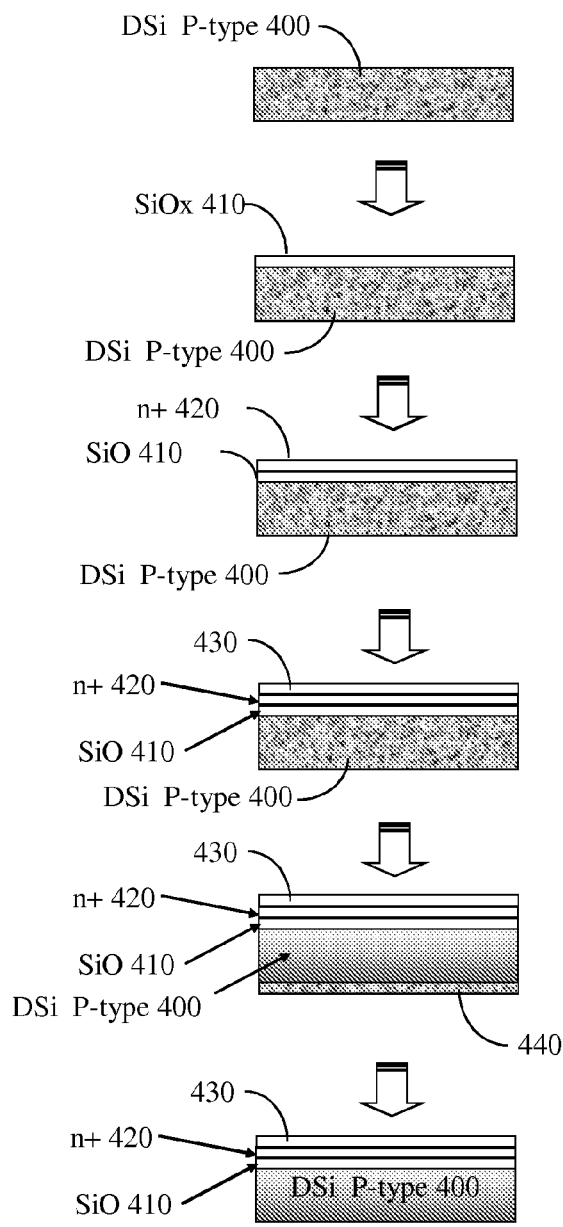
Figure 3
Figure 4

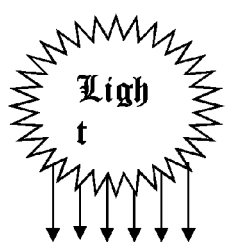
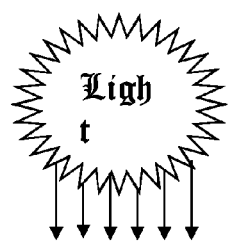
| (e) ARC (~500Å) 515 | (e) ARC (~500Å) 615 |
| (d) TCO (~3000Å) 520 | (d) TCO (~3000Å) 620 |
| (c) n type a-Si:H (200~2000Å) 510 | (c) p type a-Si:H (200~2000Å) 610 |
| (b) i a-Si:H (0-1000Å) 505 | (b) i a-Si:H (0-1000Å) 605 |
| (a) Metallurgical grade p type Si wafer (200-500μm) 500 | (a) Metallurgical grade n type Si wafer (200-500μm) 600 |
| (f) Backside Al contact (0.5μm) 525 | (f) Backside Al contact (0.5μm) 625 |
*Figure 5*      *Figure 6*

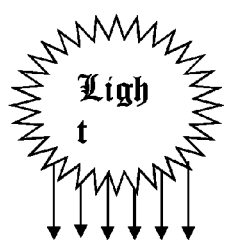
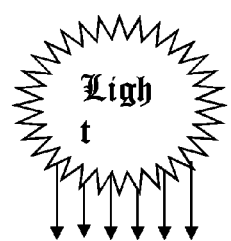
| (g) ARC (~500Å) 715 | (g) ARC (~500Å) 815 |
| (f) TCO (~3000Å) 720 | (f) TCO (~3000Å) 820 |
| (c) n type a-Si:H (200~2000Å) 710 | (c) p type a-Si:H (200~2000Å) 810 |
| (b) i a-Si:H (0-1000Å) 705 | (b) i a-Si:H (0-1000Å) 805 |
| (a) Metallurgical grade p type Si wafer (200-500μm) 700 | (a) Metallurgical grade n type Si wafer (200-500μm) 800 |
| (d) i a-Si:H (0-1000Å) 730 | (d) i a-Si:H (0-1000Å) 830 |
| (e) p type a-Si:H (200-2000Å) 735 | (e) n type a-Si:H (200-2000Å) 835 |
| (h) Backside Al contact (0.5μm) 725 | (h) Backside Al contact (0.5μm) 825 |
*Figure 7*  *Figure 8*

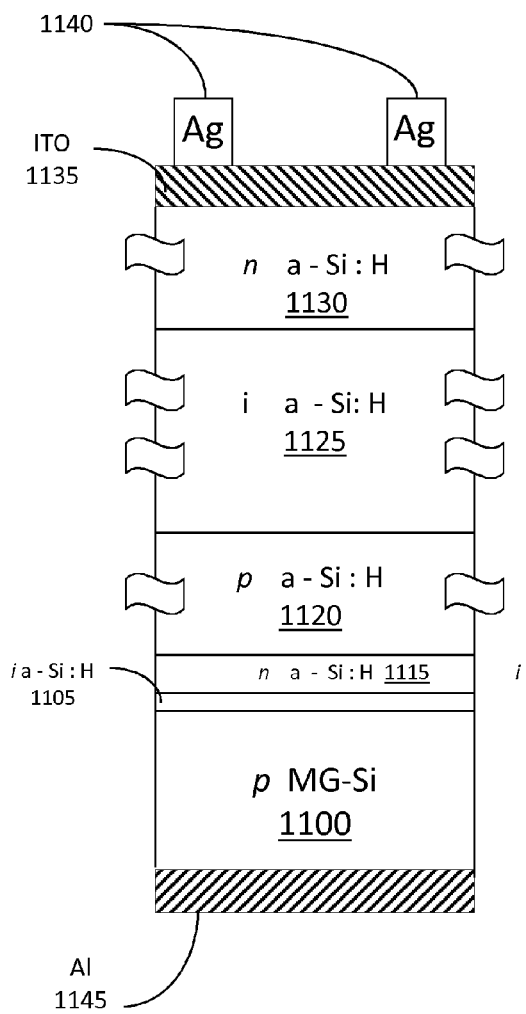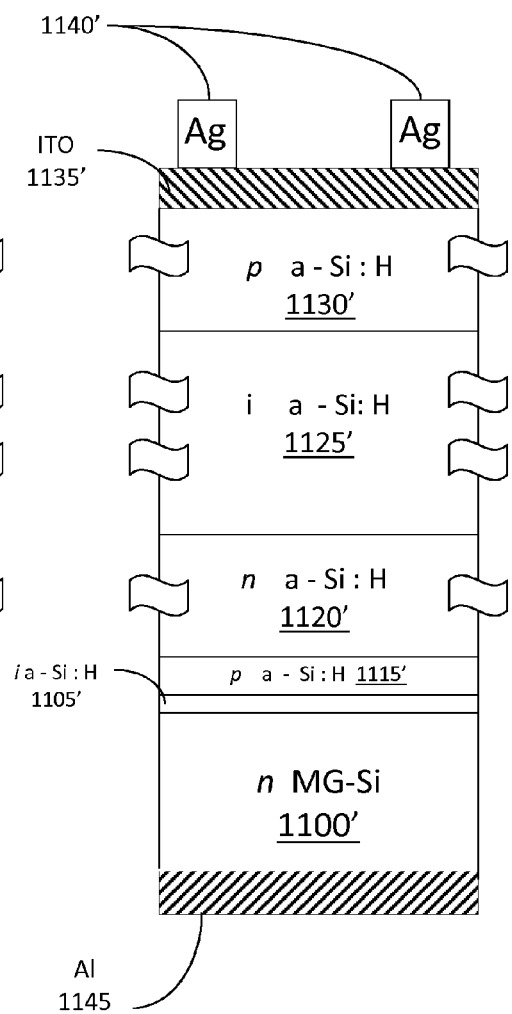
*Figure 11A*  *Figure 11B*

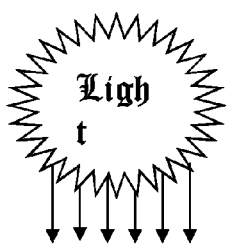
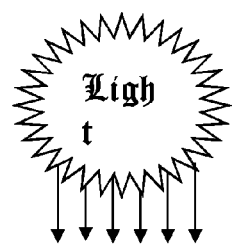
| (g) ARC (~500A) 1315 | (g) ARC (~500A) 1315' |
| (f) TCO (~3000A) 1320 | (f) TCO (~3000A) 1320' |
| (c) n type a-Si:H (200~2000A) 1310 | (c) p type a-Si:H (200~2000A) 1310' |
| (b) i a-Si:H (0-1000A) 1305 | (b) i a-Si:H (0-1000A) 1305' |
| (a) Metallurgical grade p type Si wafer (200-500μm) 1300 | (a) Metallurgical grade n type Si wafer (200-500μm) 1300' |
| (d) i a-Si:H (0-1000A) 1330 | (d) i a-Si:H (0-1000A) 1330' |
| (e) n type a-Si:H (200-2000A) 1335 | (e) p type a-Si:H (200-2000A) 1335' |
| (h) Backside Al contact (0.5μm) 1325 | (h) Backside Al contact (0.5μm) 1325' |
*Figure 13A*          *Figure 13B*

LOW-COST MULTI-JUNCTION SOLAR CELLS AND METHODS FOR THEIR PRODUCTION

RELATED APPLICATIONS

This application is a divisional of U.S. application Ser. No. 12/629,049, filed Dec. 2, 2009 now U.S. Pat. No. 7,951,640, which is a continuation in part of U.S. application Ser. No. 12/267,530, filed on Nov. 7, 2008 now U.S. Pat. No. 7,960,644, the disclosure of which is incorporated herein in its entirety.

BACKGROUND

1. Field of the Invention

The subject invention relates to solar photovoltaic cells and, more specifically, to method for manufacturing low cost base material for such cells and method for manufacturing low cost cells and the resulting cell device structure.

2. Related Art

Conventional energy generation from fossil fuels represents the greatest threat since the last ice age to the planet's well being. Among all of the alternative energy sources, next to conservation, solar photovoltaic cells are arguably the cleanest, ubiquitous and potentially most reliable alternative compared to other approaches such as ethanol, hydropower and wind power. The concept is a simple solid-state p-n junction that converts light into a small dc voltage. The cells may be stacked to charge an automobile battery or feed a power grid via a DC/AC inverter. Of various semiconductor materials available for this purpose, silicon commands 99% of the photovoltaic solar cell production. Compared to other compound semiconductor based solar cells, which do have higher conversion efficiencies, especially in small area cells, silicon is much more abundant in the earth's crust and provides proven reliability of up to 30 years on a weather-beaten roof in various climates around the world. Moreover, large-scale commercial fabrication techniques using silicon have been employed for tens of years and are well developed and understood. Consequently, silicon is likely to remain the dominant base material for solar cells.

However, despite over thirty years of work, silicon-based solar cells have not performed up to their potential for large-scale power generation. A major barrier to such acceptance is the cost associated with fabricating solar cells, and especially the cost of raw, base material (substrates) used to fabricate the solar cells. The material accounts for over half the total cost of solar cell fabrication, as compared to only about 10% in case of semiconductor microchips. Ironically, because of enormous demand and high production costs, the price of the silicon material for solar cells actually increases in tandem with the price of oil. For example, over the past few years the cost per kg of polysilicon material used to produce solar silicon wafers has increased dramatically, and for thin-film solar cells the cost of Silane gas used to deposit the film as well as that of NF3 gas to clean up the reactors following deposition have similarly increased. In contrast, semiconductor chip prices (i.e., per unit of memory or logic function) have decreased exponentially over the past thirty years, following Moore's law. This difference in learning curves can be related to major differences in the technology and relative cost contributions of materials versus process and design for ever increasing device density per unit area.

According to the current state of the art, polysilicon-based solar cell production is done in three major stages. First, large quantities of silicon wafers are produced for the substrate—typically a million wafers per month for a rather modest 25 MW capacity factory. Second, these wafers are processed into solar cells by forming a p-n junction and metallization. Third, these wafers are then "packaged" into a module for installation into the users' facilities.

The base silicon wafers for the solar cells are made by thermally decomposing hazardous gases containing Si—H—Cl, such a di-chlorosilane and tri-chlorosilane, to produce ultra-high purity polysilicon, generally referred to as nine nines, i.e., 99.9999999% pure. These gases are both highly flammable and toxic. However, due to the environmental and health hazards in the gasification of silicon, few factories operate in the world, thereby causing a bottleneck for the semiconductor and solar cell industry. Newly proposed silicon gasification factories face resistance from local communities based on environmental and safety concerns. These factories also require large capital investments and long lead times. Consequently, there is always an imbalance between demand and supply of bare silicon wafers.

The pure silicon (called polysilicon, following gasification and decomposition of the silane-based compounds) is generally provided in the form of pellets fit for semiconductor and solar cell applications. The pellets are then melted and, using a seed, a single crystal boule or multi-crystalline ribbons are pulled. Alternatively, the polysilicon is cast into cylindrical shape. The pulled cylinder is-saw cut, shaped and polished into 5-6 inch round wafers, which thereafter may be cut into square wafers. Wet chemical etch in an alkaline chemical such as KOH is then applied for texture. The p-n junctions are formed with POCl3 furnace diffusion. Anti-reflective coating passivation is then applied with PECVD SiON. Screen printing silver paste is applied to n-type surface and aluminum paste is applied to the p-type surface. The paste is then sintered to form electrical contacts. Finally, the cells are tested and sorted according to their characteristics, e.g., their I-V curve.

The above processes are well known and have been practiced in the industries for many years. However, while in semiconductor the majority of the cost (i.e., the value) is in the processes that transform the polished silicon wafer into a functioning integrated circuit, in solar cell fabrication the processes that transform the polished wafer into a functioning solar cell are less costly than the processes to produce the polished wafers themselves. That is, in commercial terms, the process of transforming a silicon wafer into solar cells is not a high-value added step in the overall chain of solar panel fabrication. Therefore, any improvement or reduction in costs for manufacturing the starting wafers—as opposed to improvement in cell-fabrication technology—would enable drastic reduction in the price of the finished solar panels.

To overcome the problem of Silicon raw material for solar cells, there have been aggressive efforts along two main approaches to reduce the amount of Silicon consumed per watt of the solar cell. These are:

1. Reduction of the wafer thickness from the standard 500 μm to ~300 μm. This approach is limited by the strength of the wafers, which tend to break during high-speed transport through process equipment.
2. Use of thin films of various solar cell materials such as Silicon, CdTe, CuInGaSe typically on glass and other cheaper substrates. To allow the light irradiation on the solar cell, one of the electrodes is made up of a conducting transparent oxide (CTO), such as $InSnOx$ or $ZnO_2$.

Among various thin-film solar cell materials, again Silicon is the most cost effective materials. In the solar structure, the thickness is reduced to about 1-10 μm from 300-500 μm for wafers. Of this 1-10 μm, most of the deposited film thickness typically consists of an undoped intrinsic amorphous layer of Si-H polymer, abbreviated as i a-Si:H layer. This i aSi:H layer, which is sandwiched between the doped n-type a-Si:H and p-type a-Si:H films, provides the volume needed for the absorption of the incident sunlight, whereby electron-hole pairs are created. These carriers then diffuse to the n- and p-electrodes of the solar cell to create a photovoltaic voltage and current for power generation. However, because the infrared wavelengths of the solar spectrum have long transmission depths through silicon, a significant amount of solar radiation is lost, thereby reducing the efficiency of the photovoltaic conversion. That is, quantum efficiency of conversion is lost, particularly for the longer wavelengths in the infra-red range. Another intrinsic limitation of thin film structures is that the minority carrier diffusion lengths are limited by the thickness of the film to much less than 10 µm. This is a figure of merit for predicting the solar cell efficiency of the finished product. For pure crystalline silicon based solar cells, the diffusion lengths are typically about 80 µm.

There are other fundamental limitations to thin-film solar cell structures, which have so far limited the thin-film solar cell production to about 5% of the total solar panel market, compared to over 80% for the silicon wafer-based solar cells. Some of these limitations are as follows:

1. Cost of Silane gas for depositing the a-Si:H films has been rapidly rising for the same reason as the price of polysilicon, namely capacity shortages of this extremely flammable gas. Besides Silane, the plasma enhanced CVD reactors used to produce thin solar films need large amounts of a specialty $NF_3$ gas to perform in-situ plasma cleaning of the PECVD reactor to ensure a high uptime of the production equipment.
2. The photovoltaic conversion efficiency of thin film silicon solar cells is low, sometimes less than half that of silicon wafer-based solar cells.
3. The capital equipment needed to set up a thin-film solar cell factory, generally at about $50 M, is nearly 10 times that for a silicon wafer-based solar cell factory of comparable energy output. The capital cost is mainly driven by vacuum based plasma CVD reactors used to deposit the a-Si:H and SiN passivation films, and vacuum based PVD reactors used to deposit the CTO films.

As can be understood from the above, the solar cell industry has been bifurcated into two camps: the silicon wafer-based solar cell camp that seeks to utilize highly pure silicon wafers to obtain high cell efficiency, and thin-film camp that shy away from using silicon wafer substrates in order to reduce costs. Consequently, the silicon wafer-based camp is constrained by the availability of pure silicon wafers, while the thin-film camp is constrained by conversion efficiency, mainly due to insufficient absorption of light in the glass substrate, as well as by the cost of SiH4 gas needed to produce relatively thick absorbing layer of intrinsic hydrogenated silicon.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the subject invention provide methods for fabricating silicon substrates without the need to perform gasification of silicon. Consequently, the costs and health and environmental hazards involved in fabricating the nine-nines grade silicon are being avoided. The substrates may be used for fabrication of solar cells with efficiency that is comparable and even surpasses thin-film solar cells.

Features of the invention address one or more of the following critical issues facing the solar cell industry:
  a) Availability and cost of "solar capable" silicon material, both for wafers and thin films
  b) Capital cost for solar cell factories
  c) Cost per watt of future solar cells.
  d) Scalability of the Production Process for large volumes
  e) Environmental compatibility and 25-year reliability Features of the invention enable achieving a production-worthy solution to the abovementioned problems, by, among others, fabricating a solar cell structure that capitalizes on the conversion efficiency of bulk silicon wafers and the benefits of thin film cell structures. According to aspects of the invention, the solar cell is fabricated by utilizing silicon wafers made of very low cost metallurgical-grade silicon as the substrate, and fabricating a thin-film solar cell on the substrate. According to features of the invention, the cells are fabricated by depositing thin films of very small thicknesses (e.g., 10%) compared to conventional thin-film solar cells. Besides reducing the cost of both substrate and film material, the proposed structure promises an increased conversion efficiency over conventional thin film solar cells. That is, by utilizing metallurgical-grade silicon wafers the fabrication of substrates becomes less hazardous and more environmentally friendly, while also reducing the cost of the substrates. Moreover, the utilization of metallurgical-grade silicon wafers as the substrate, the conversion efficiency is increased as compared to thin-film structures formed on glass. A method for preparing substrates using metallurgical grade silicon is disclosed, the method comprising: melting metallurgical grade silicon in a furnace; solidifying the melted metallurgical grade silicon into an ingot; slicing the ingot to obtain a plurality of wafers; polishing and cleaning each wafer; depositing aluminum layer on backside of each wafer; depositing a layer of hydrogenated silicon nitride on front surface of each wafer; annealing the wafers at elevated temperature; removing the hydrogenated silicon nitride; and, removing the aluminum layer. The backside aluminum layer forms a seal as the hydrogen is driven into the substrate during the deposition of the hydrogenated silicon nitride layer. In order to remove impurities, the method may also include a step of cutting the peripheral sections of the ingot prior to slicing the ingot. This can be done especially when using preferential melting and cooling of the ingot so as to drive the impurities to the peripheral section of the ingot. In order to increase light absorbency by the bulk of the substrate, so as to generate electron-hole pairs, the method may include the step of texturing the front surface of the wafers after the steps of removing the hydrogenated silicon nitride and aluminum layers. Texturing the front surface may be done by etching the front surface of the wafers; depositing a layer of SiO2 or Si on the front surface of the wafers; and etching the deposited layer such that the deposited layer partially remains at the grain boundaries. The method may further comprise dry etching the front surface prior to depositing the layer of SiO2 or Si.

According to further aspects of the invention, a method for making solar cells using metallurgical grade silicon is provided, comprising: forming multi-grain wafers of metallurgical grade silicon; neutralizing grain boundaries at the front surface of each wafer; and forming a solar cell structure on the front surface of each wafer. Neutralizing the grain boundaries may comprise depositing SiO2 or Si at the grain boundaries. Depositing SiO2 or Si at the grain boundaries may comprise: depositing a layer of SiO2 or Si on the front surface of each wafer; and, etching the deposited layer such that the deposited layer partially remains at the grain boundaries. The method may further comprise depositing a layer of intrinsic amorphous silicon on the front surface of the wafer and depositing an n-doped layer over the of intrinsic amorphous silicon layer. The layer of intrinsic amorphous silicon and n-doped layer may be hydrogenated.

According to a further aspect of the invention, a solar cell is provided, comprising: a metallurgical grade silicon substrate having a back surface and a front textured surface; a contact layer formed on the back layer; an intrinsic amorphous silicon layer formed above the front surface; and, an n-type silicon layer formed over the intrinsic amorphous layer.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate features of the exemplary embodiments in a diagrammatic manner. The drawings are not intended to depict every feature of actual embodiments nor relative dimensions of the depicted elements, and are not drawn to scale.

FIG. 3 illustrates a process according to another embodiment of the invention.

FIG. 4 illustrates a process according to an embodiment of the invention.

FIG. 5 illustrates another embodiment of the invention.

FIG. 6 illustrates another embodiment of the invention.

FIG. 7 illustrates another embodiment of the invention.

FIG. 8 illustrates another embodiment of the invention, which is similar to that of FIG. 7, except that the dopants are reversed.

FIGS. 11A and 11B illustrate embodiments for multi-junction SmartSi solar cells.

FIGS. 13A and 13B illustrate embodiments of symmetrical arrangement of metallurgical Silicon substrate sandwiched between i-Si/doped-Si:H thin films on both sides.

DETAILED DESCRIPTION

Embodiments of the subject invention provide methods for manufacturing solar cells at reduced costs, while reducing the health and environmental hazards involved in conventional solar cell manufacturing. As noted on the Solar Energy website of the U.S. Department of Energy: "to be useful as a semiconductor material in solar cells, silicon must be refined to a purity of 99.9999%." (Available at http://wwwl.eere.energy.gov/solar/silicon.html.) This is generally referred to as 6N, or solar grade silicon, SoG Si. In contrast to conventional wisdom, the subject invention provides methods for producing substrates and solar cells using metallurgical grade silicon, MG Si, of purity of 3N-5N. Various embodiments disclosed combine the benefits of silicon based solar cells with those of thin-film based solar cells to provide cells having conversion efficiency of about 14%.

Figure 1:
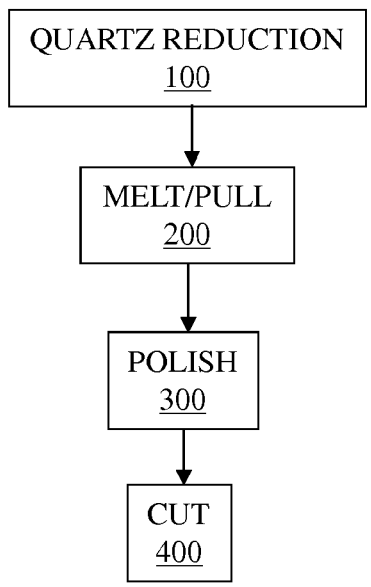
FIG. 1 is a flow chart illustrating a process according to an embodiment the invention.

FIG. 1 is a flowchart illustrating a process according to an embodiment of the invention. In FIG. 1, the process starts in step 100 by producing metallurgical silicon pellets starting material by reducing quartz with graphite. The obtained purity level may be at 99.9% or 99.999% purity, i.e., about three-nines up to about five-nines purity. Notably, quartz is easily available at low cost. Moreover, this process skips the gasification step, thereby avoiding the hazardous process of gasification and silane production.

In the next step, 200, the powder is melted into 5 in., 6 in., 8 in., etc., square or round molds and the liquid is allowed to slowly solidify into a cylinder with large silicon grains Optionally, the solidified cylinder is re-melted and then solidified in sections, so as to move impurities to one side of the cylinder. In this process the cooling rate and temperature gradient is controlled in horizontal direction so as to cause impurities to move to the surface of the cylinder and in the vertical direction to cause the impurities to concentrate at the silicon grain boundaries. In step 200 the melted silicon is optionally doped with a small amount of boron to produce p-Si with 1E17-1E18 cm-3 of boron. Alternatively a p-type single crystal may be pulled from the melt using the conventional Czochralsky process. In step 300 the surface of the solid cylinders are machined to a polished state. In step 400 the cylinder is cut into Si wafers, about 20 mils, i.e., 0.020 in. thick, using, e.g., diamond or wire saw, and then the surface is polished on one side, while the other side is chemically etched to a smooth finish. The scrap may be collected for reuse in the melt. Once the solar cell fabrication is completed (with all of the processes described below completed) if desired the wafer may be thinned down further, so that the p-layer is about 0.007 in.

Figure 2:
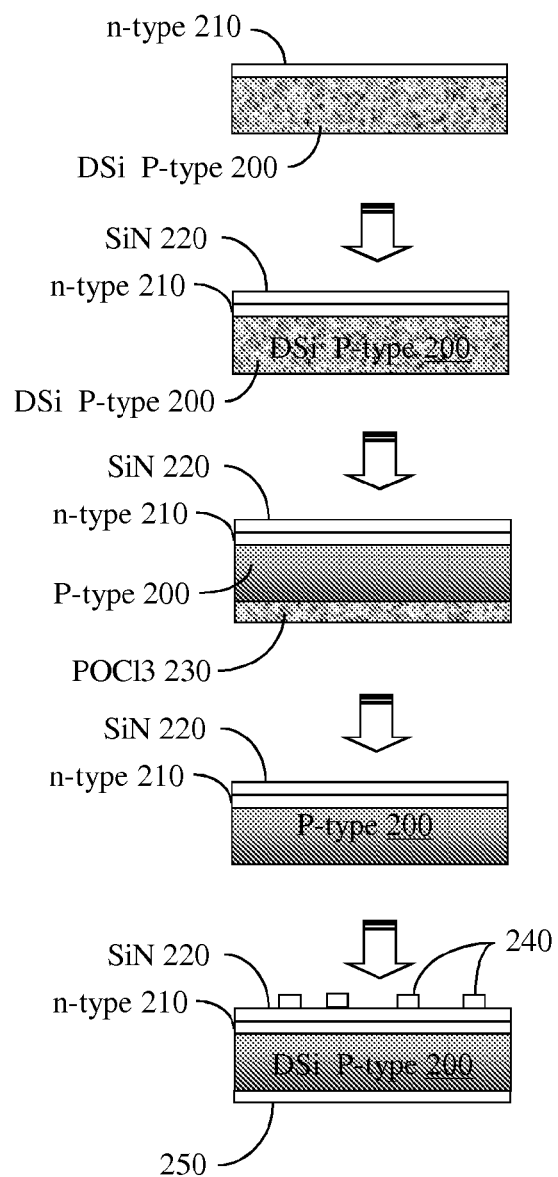
FIG. 2 illustrates a process according to an embodiment of the invention.

FIG. 2 illustrates a process according to an embodiment of the invention. The process begins with a wafer DSi 200, made of "dirty" silicon, i.e., metallurgical silicon of the 3-5 nines obtained, e.g., by the process of the embodiment of FIG. 1. The wafer 200 is exposed to POCl3 at about 900° C., using conventional oven, so as to provide an n layer on top of the wafer 210 with concentration of $1.0e16 atoms/cm^3$. Then plasma chamber is used to provide SiN layer 220 on top of the n-type layer 210. Then a POCl3 process at temperature higher than 900° C. is used to extract impurities from the DSi layer 200 into melted glass layer 230. This increases the purity of P-type layer 200 especially around the previously formed junction. The layer 230 is then stripped back using, e.g., etch-back of chemical-mechanical planarization (CMP) process. This removes the layer 230 with its impurities that were extracted from layer 200. Finally silver contacts 240 are laid over the n-doped layer 220 and an aluminum electrode 250 is provided over layer 200. The entire structure is then annealed at around 700 C to allow Silver electrodes to make low-resistance Ohmic contact to the n-type layer 210 and the Aluminum electrode 250 to the p-type layer 200.

FIG. 3 illustrates a process according to another embodiment of the invention. The process starts at step 100 by subliming a 2 μm thick layer of amorphous silicon from a crucible containing metallurgical silicon. This should be done at 1000-1200 C, below the melting point of silicon, in an Ar background vacuum of about 10E-6 torr. This step defines the active junction layer, relatively pure since any carbon and metallic impurities don't sublime at 1200 C. Also, small amounts of residual oxygen in an argon background environment help catalyze the sublimation via formation of a small amount of Si-mono oxide on the crucible surface. At Step 200 the wafer is exposed to a P-containing gas, such as POCl3 or PBr3 in an ambient of O2 plus N2 or Ar. This step forms the p-n junction by doping the surface n-type and allowing out-diffusion of B from the "dirty" substrate into the clean sublimed Si layer.

The backside of the wafer is then etched or CMP (chemically—mechanically polished) at Step 300 to remove any Phosphorous doped glass. Next, in Step 400, plasma is used to deposit SiN anti-reflective coating on the front (n-type) side of the wafer. In Step 500 contacts are formed, e.g., laser may be used to drill holes for contacts. At Step 600 the conductive electrodes are made, e.g. , silkscreen or other methodology may be used to deposit metal paste on both front and backside to define the electrode. The wafer is then sintered at 600 C-700 C to form the contacts. The higher temperature is used to enable silver to penetrate through the entire SiN layer in the case when silk-screened silver is deposited on the SiN anti-reflective coating without any laser drilled contact holes through this layer.

FIG. 4 illustrates a process according to an embodiment of the invention. The process starts with a dirty p-type silicon wafer 400. Then an evaporation process is used to generate an evaporated SiOx layer 410 over the wafer 400. An n-type layer 420 is provided (This could be done through partial diffusion into the layer 410, by deposition of phosphorous-doped Si layer, or by other acceptable means) over the SiOx layer 410. Layer 410 is then sealed using layer 430, and gettering is used to pull the impurities towards the bottom part 440 of wafer 400 to provide enhanced purity layer 400. The bottom part 440 may then be removed before the conductive lines are deposited.

According to yet another embodiment, a dirty silicon wafer is first etched to provide texture on its top surface. The wafer is then treated in a POCl3 furnace to form the p-n junction of the wafer. The top surface of the wafer is covered with a plasma deposited SiN layer. The wafer is then re-expose to POCl3 to getter all of the metal impurities into the backside, and harden the junction from leakage. The glass on the backside of the wafer is then removed by, e.g., backside etch. Contact holes are then formed using, e.g., laser drilling or contact etch. Metal contacts are then formed using conventional technology. Or else, screened silver paste is formed directly on top of the plasma deposited nitride layer and then annealed at ~700 C to diffuse the Silver into the Phosphorus doped layer near the top of the wafer, without the use of any contact holes.

Notably, once the metallurgical Si p-n junction is formed, it is quite leaky due to metallic impurities in the junction interface. One effect of POCL3 is to form the n-layer is to pull the impurities near the surface where the junction is formed. Therefore, in this embodiment a second POCl3 step is performed, while protecting the active front side with SiN, in order to remove the metal impurities from the front junction into the backside of the wafer. The metals may be accumulated in a low-temperature melted glass on the backside of the wafer, and then removed by chemical etching or CMP.

Instead of silicon substrate, one may use a substrate made of stainless steel or glass coated with sublimed Si, and form a p-n junction therein by diffusion from a spun-in B,P glass. This is different from amorphous PECVD Silicon deposited for thin film transistor flat panel applications in that the sublimed films do not have any trapped hydrogen. Consequently, they should not degrade upon subsequent high-temperature diffusion steps. The PECVD films lose efficiency with time, probably because of composition changes associated with H-desorption.

FIG. 5 illustrates another embodiment of the invention. The starting material for the embodiment of FIG. 5 is a low-cost multi-crystalline metallurgical silicon wafer of purity of about four 9's to five 9's, i.e. 99.99% to 99.999% made by casting followed by slow cooling. The metallurgical Silicon is simply made from a furnace-based chemical reaction of quartz ($SiO_2$) with graphite (C), both found in mines in various parts of the world. These two materials are essentially purer forms of sand and coal. The graphite could be substituted with other pure C containing by-products of petroleum or organic plant matter. The metallurgical silicon powder is melted, a measured amount of B is added to the melt as necessary to produce about $5E17$ atoms*cm$^{-3}$ of p-type dopant concentration. The melt is slowly cooled to produce cylindrical shaped ingots containing multi-crystalline grains of silicon with about 10 ppm of impurities such as Cr, Fe, Ni, Mn and C. The cooling process is adjusted so as to cause the impurities to be distributed in atomic clusters called precipitates. They tend to be less electrically active than homogeneously distributed atoms, which typically occupy substitutional, electrically active sites on the silicon crystal lattice. The substitutional impurities act as traps or centers for electron hole recombination, which is thought to degrade the photovoltaic conversion efficiency of the solar cell, by reducing the diffusion length of charge carriers in the light absorbing layer. The diffusion length can be estimated through well-known physical methods of testing for quantum efficiency of light conversion into charge carriers as a function of light wavelength. The cast material, ingot, is machined into smaller cylinders, sawed into wafers, etched to remove surface damage and then polished on one or both sides in accordance with standard industry practices. This resulting metallurgical-grade wafer is used as a substrate for producing solar cells. Unlike silicon substrates used for conventional multi-crystalline silicon solar cells, this embodiment does not require the use of polysilicon of seven 9's purity or higher, conventionally made by reduction of vapor phase $SiH_xCl_y$ compounds.

The substrate 500 is subjected to a pre-deposition clean, typically involving 100:1 HF to remove any native oxides, $NH_4OH/H_2O_2$ to remove organic contamination, and then HCl to remove any metallic contaminants. It is then coated with a very thin (10-1000 Å) layer, typically below 100 Å, 505 of intrinsic, undoped amorphous Si:H in a standard PECVD equipment utilizing a plasma generated in $SiH_4$ and $H_2$ with no dopant gases present. Next, the active part of the junction is formed by depositing a layer 510 of n-doped a-Si:H, which may conveniently be performed in the same apparatus, but with a plasma containing $PH_3$ in addition to $SiH_4$ and $H_2$. This is followed by successive layers of a transparent conductive oxide 520, such as $ZnO_2$ or InSnO and, if needed, an anti reflective coating 515 consisting of SiOxNy. These form the top electrode through which sunlight can be transmitted into the bulk silicon absorbing layer. For additional charge collection efficiency, a series of electrodes typically consisting of silver paste may be formed over the transparent conductive oxide layer 520. For a low-resistance contact to the back of the cell structure, the bottom side of the wafer is coated with a layer 525 of Al, either deposited through a PVD process or a silk-screened paste containing Al, and then sintered to form a low-resistance contact.

The resulting solar cell structure then contains at least the following novel features. A p-n junction formed by depositing an n-layer of amorhous Si:H thin film on and absorbing wafer made of a p-type, multi-crystalline metallurgical-grade silicon wafer, costing about ten times less than conventional silicon wafers made using solar or semiconductor grade poly-silicon. A light absorbing layer of metallurgical p-type multicrystalline silicon of thickness 250-500 μm, made by casting metallurgical Silicon powder with B dopant instead of using a much more expensive solar-grade polysilicon. An optional intermediate layer of intrinsic (undoped) Si:H film is inserted between the p-type metallurgical substrate and the a n-Si:H film to passivate the surface of metallurgical silicon that will typically have broken (dangling) bonds due to its multi-crystalline nature and impurities in the material, and thereby improve photo-voltaic conversion efficiency. The ARC layer 515 may be omitted for cost saving, and instead the surface of the metallurgical grade silicon can be roughened up through etching it in KOH to expose (111) facets in the mainly (100) oriented grains. This roughening minimizes light reflection, so that the ARC layer may be unnecessary.

FIG. 6 illustrates another embodiment of the invention. The embodiment of FIG. 6 is similar to that of FIG. 5, except that the doping is reversed. That is, the absorbing layer 600 is fabricated as an n-type metallurgical silicon. The deposited amorphous layer 610 is of opposite polarity, i.e. p-type for junction.

FIG. 7 illustrates another embodiment of the invention. The embodiment of FIG. 7 is similar to that of FIG. 5. However, in the embodiment of FIG. 7, an optional structure consisting of a-i Si:H film 730 followed by a-n Si:H film 735, is fabricated prior to fabricating the backside contact aluminum layer 725, so as to increase the conversion efficiency with a hetrojunction with an intrinsic passivation layer structure containing a very thin deposited intrinsic Si-H layer followed by an electrically active thin Si-H layer of opposite polarity than that of the absorbing substrate. In this respect, for the described embodiments of FIG. 5-8, the suggested order of fabrication is indicated for each illustrated layer by parenthetical letters. FIG. 8 illustrates another embodiment of the invention, which is similar to that of FIG. 7, except that the dopants are reversed. That is, the substrate is name of n-type metallurgical-grade silicon, junction layer 810 is p-type, and layer 835 is n-type.

As can be appreciated, the embodiments of FIGS. 5-8 provide a solar cell by constructing a thin-film junction over a metallurgical-grade silicon substrate. This has the advantage of better light absorbance due to the properties of the metallurgical silicon, as compared to conventional thin-film cells having very thin absorbing layer. Consequently, conversion efficiency is increased. On the other hand, the use of metallurgical silicon wafers provides low cost comparing to conventional solar or semiconductor grade silicon wafers. Moreover, by using the metallurgical-grade silicon wafers as described herein, health and environmental hazards are reduced.

The intent relating to the embodiments of FIGS. 5-8 was to separate the three functions involved with the PV-process, which converts light into electricity by first absorbing light in the silicon to create electron-hole pairs and then creating a minority carrier (electron) current by taking advantage of the bandgap at the p-n junction. Normally, in multi-crystalline or mono-crystalline silicon with a diffused p-n junction structure, both processes happen simultaneously. Minority carrier diffusion lengths, which can range from 50 to 100 to 300 μm upon going from conventional multi-crystalline silicon to single crystal Czochralsky Si to single-crystal float zone refined silicon. The corresponding PV conversion efficiencies are about 18%, 22% and 25%. At the other end, amorphous single junction deposited thin-film solar cells rely on an intermediate aSi:H layer, typically about 1 μm thick, to be the absorbing layer. The diffusion length is limited by the thickness of the thin-film layer to about 1 μm. The corresponding PV conversion efficiency is lowered to about 6%. In the embodiments on this invention the minority carrier diffusion length is not limited by the thin film, but is rather determined by the characteristics of the metallurgical silicon substrate.

EXAMPLE I

Metallurgical grade silicon of three nines was produced by inductively melting silicon pellets of two nines in a graphite crucible of about 1.5 m×1.5 m, and then slowly cooling into a cylindrical shape over 24 hrs. The carbon-rich surface crust was removed, and the cylinder crushed into grains or pellets. The resulting material contained both B and P, but was generally p-type with resistivity in the range 0.1-1 ohmcm. The resulting material was then cast into metallurgical grade silicon ingot of about 0.5 m×1 m, with controlled cooling and dopant adjustment. Metaflurgical grade silicon wafers were fabricated by machining 6 in. cores out from the ingot, the cylinder surface was smoothed and then 500 μm thick wafers were sawed off the cylinders. One surface was mechanically polished, and both surfaces were lightly etched to reveal the large polygonal grain structure on the back of the wafer. This resulted in about 500 metallurgical grade silicon wafers of four nines and five nines purity. The wafers were binned into two groups using 4-point probe measurements—a majority group with resistivity of 0.3-0.5 ohmcm, and the remainder at ~1 ohmcm. SIMS composition profile of both 4N and 5N material was similar, with transition metal impurity levels of 1E14 atoms $cm^{-3}$. The metal impurities were typically those associated with metallurgical silicon, namely Fe, Cr, Mn, Co, Ni, Cu. In addition, a substantial level of carbon at 1E15 atoms $cm^{-3}$ was present.

Samples of the wafers were used to fabricate solar cells. A PECVD (Plasma Enhanced Chemical Vapor Deposition) tool was used for depositing thin films of i type a-Si:H , p type a-Si:H and n type a-Si:H films using an rf plasma in $SiH_4$, $H_2$ with appropriate dopant gases—$PH_3$ and $B_2H_6$. A PVD (Plasma Vapor Deposition) sputtering tool was used to deposit about 1000 Å of $In_xSn_yO_z$ to use as a transparent conducting oxide for both top and bottom electrodes. An etch equipment was used to etch about 10 μm deep silicon mesas to create diodes isolated from rest of the wafer. With this process, starting with a 0.1 Ωcm p-type (100) metallurgical-grade silicon wafer, a single hetrojunction with an intrinsic passivation layer structure with diffused p+back-contact was created and measured for diode I-V and quantum efficiency across the spectral range. With a plot of 1/QE vs X, the wavelength, the slope provided the diffusion length L in µm. The length L and $I_{Dsat}$ are well-known predictors of PV conversion efficiency. This structure provided an $I_{Dsat}$ of 400 mA and a length L of 80 µm, which corresponds to a PV conversion efficiency of about 20%. A structure formed on a 0.4 Ωcm p-type metallurgical-grade silicon wafer also worked quite well with a minority carrier (electron) diffusion length, $L_e$ of 7 µm which corresponds to a PV conversion efficiency of 12~13%, assuming a structure with well controlled series resistance. A structure formed on a 1.0 Ωcm p-type metallurgical-grade silicon wafer also worked quite well with a minority carrier (electron) diffusion length, $L_e$ of 8 µm which corresponds to a PV conversion efficiency of 14%, assuming a structure with well controlled series resistance.

EXAMPLE II

A single hetrojunction with an intrinsic passivation layer device structure is formed on low-cost metallurgical-grade substrates by depositing a nano-scale Si:H film stack on the front, i.e., "device" side, and an oppositely doped a-Si:H film on the back "contact" side. The metallurgical-grade substrates obviates the need and expense of aggressively thinning the substrate from 500 to 250 µm as is done for crystalline Si substrates. The thicker wafers provide more robust handling in automated process lines. This material also avoids the cost, cycle time and complexity of polysilicon based gasification, solidification, melt-and-pull process, since the active device is created by a thin Si:H film just outside of the metallurgical-grade substrates surface that is passivated by a nano-scale intrinsic a-Si:H film.

The metallurgical-grade substrates may be formed in standard, e.g., 6-in, 8-in, 12-in, sizes, which can be processed in standard semiconductor PECVD processing equipment. In contrast, conventional thin-film based solar cells are created on large area (generally, 4×6 ft or 6×7 ft) glass, which requires specially built chambers having large internal volume, which causes difficulties in pumping to low pressure and causes waste in the reactive gases used for forming the thin film layers. Consequently, these PECVD reactors are expensive to purchase and expensive to operate due to high cost of consumables (i.e., wasted reactive gases). The high internal volume of these specially built chambers also poses abatement difficulties and costs. Conversely, forming thin-film on standard size wafers can be done in standard reactors having small internal volume, so that operation and abatement issues are minimized. The resulting thin film device structure on the metallurgical silicon substrate has a PV efficiency that is about twice greater than that for conventional thin-film solar cells, thanks to an order of magnitude longer minority carrier diffusion lengths in the metallurgical silicon substrate.

EXAMPLE III

Figure 9A:
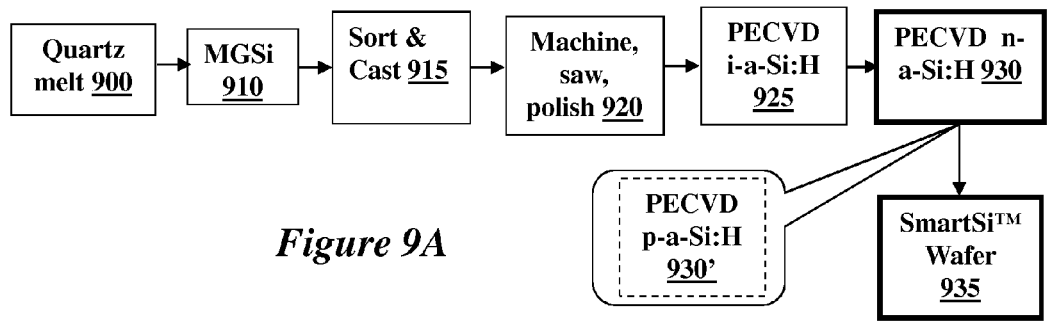
FIG. 9A illustrates an example of a process for fabricating a solar-cell ready substrate, generally referred to herein as SmartSi™.

FIG. 9A illustrates an example of a process for fabricating a solar-cell ready substrate, generally referred to herein as SmartSi™. In step 900 metallurgical grade quartz is melted and reduced in an electrolytic cell containing graphite electrode and is then let cool and solidify to provide a ingot of about two nines metallurgical silicon. The ingot is broken into pellets, treated in chemicals to leach surface impurities and then cast into ingot. The ingot is then striped of its crust and broken into nuggets of three to four nines metallurgical silicon. The resulting nuggets are sorted according to their resistivity.

The sorted nuggets of MG silicon are cast in step 915. The melt is allowed to solidify into an ingot, which in step 920 is machined, cut into wafers, and the wafers are polished. In step 925 a PECVD chamber is used to form a thin layer of intrinsic amorphous silicon, i-a-Si:H, to passivate the surface of the MG-Si substrate. In step 930 a PECVD chamber is used to form an n-type layer, n-a-Si:H over the passivation layer. At this point, a "SmartSi" wafer 935 has been created that enables forming a PV solar cell industry practically anywhere in the world with a very small investment, relatively small number of simple machines, and with very little technical knowledge. That is, as can be appreciated, all that is required in order to convert the SmartSi wafer into a solar cell is to make front and back contacts, and perhaps an anti reflective and protective layer. This can be done easily using current silk-screen or printing technology. Also, as shown by the callout, another step of PECVD 930' may be performed to form a p-type later 935' at the backside of the substrate, so as to improve the contact to the conductive layer that would follow.

Figure 9B:
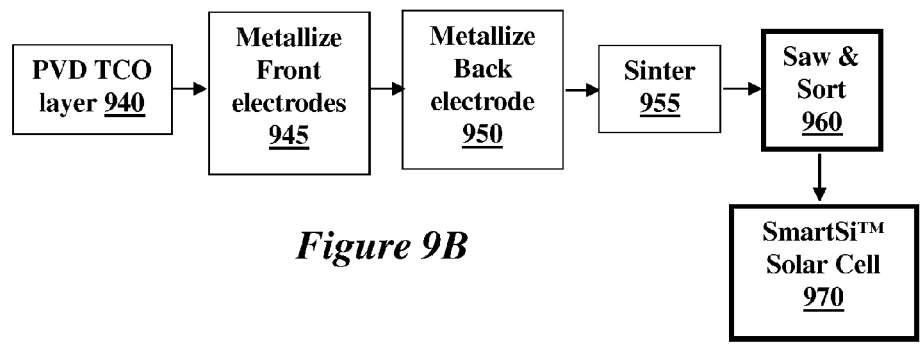
FIG. 9B illustrates an example of a process that can be used to convert a SmartSi wafer into a SmartSi PV solar cell.

FIG. 9B illustrates an example of a process that can be used to convert a SmartSi wafer into a SmartSi PV solar cell. As noted above, what is required is to form contacts in the back and front of the SmartSi substrate. As for the front, one conventional method is to form conductive metal grid. The usual approach is to design grids with many thin, conductive fingers spreading to every part of the cell's surface. The fingers of the grid must be wide enough to conduct well (with low resistance), but narrow enough so as not to block much of the incoming light. This kind of grid keeps resistance losses low while shading only about 3% to 5% of the cell's surface. The top-surface grids may be made of, e.g., aluminum, silver, or molybdenum metal, by depositing metallic vapors on a cell through a mask, paint them on via a screen-printing method, or use photolithography, which provides the highest quality, but has the greatest cost.

An alternative to metallic grid contacts is a transparent conducting oxide (TCO) layer, such as tin oxide (SnO2) or indium tin oxide, generally known as ITO. The advantage of TCOs is that they are nearly invisible to incoming light, and they form a good bridge from the semiconductor material to the external electrical circuit. The embodiment shown in FIG. 9B utilizes TCOs as the contacts to the front of the cells. In step 940 the TCO layer is formed using CVD process. In step 945 front contacts are mettalized using, e.g., metallic paste traced upon the front surface using silk screen, printing, etc. In step 950 the back contact is mettalized to form collector electrodes using, e.g., metallic paste (e.g., silver paste) traced upon the back surface using silk screen, printing, etc., or by sputtering aluminum or other metal on the back of the substrate. When using paste to mettalize the front contact it is desirable to sinter the wafer in order to form a good ohmic contact, as shown in step 955. In step 960 the wafers are cut to the desired shape, e.g., if processing was performed using circular wafers, in this step they may be cut into squares. The wafers are then sorted according to conversion efficiency, so as to result in SmartSi PV cells 970.

In all of the above described embodiments, prior to forming any of the layers the MG Si substrate may be texturized on one or both sides by ,e.g., etching in alkaline solution, such as potassium hydroxide solution. The substrate may be then rinsed and dried, e.g., by heating the substrate. Furthermore, plasma discharge of hydrogen gas may be used to reduce the amount of carbon on the surface of the substrate. The intrinsic amorphous silicon thin film layer may be formed in a PECVD chamber using silane gas (SiH4) mixed with hydrogen gas (H2). The n-type amorphous silicon thin layer may be formed in a PECVD chamber using silane, hydrogen, and phosphine gas (PH3). The p-type amorphous silicon thin layer may be formed in a PECVD chamber using silane, hydrogen, and diborane gas (B2H6).

Figure 10:
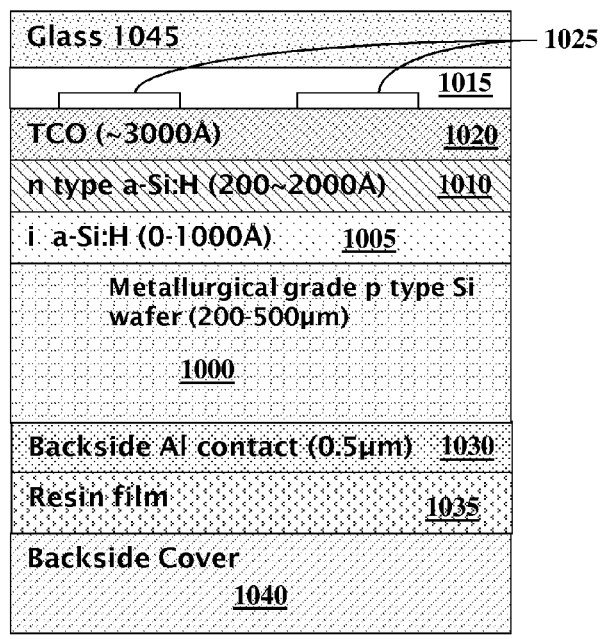
FIG. 10 illustrates a completed solar cell, fabricated according to the embodiments of the invention.

FIG. 10 illustrates a completed solar cell, fabricated according to the embodiments of the invention. The solar call is formed over a metallurgical grade silicon substrate 1000, which in this example is doped p-type. Then an intrinsic amorphous silicon layer 1005 is formed on the top side, followed with an n-type amorphous silicon layer 1010. An TCO layer 1020 is formed over the n-type layer, and contacts, e.g., silver contacts 1025 are formed over the TCO to formed good ohmic contact. A back contact may be formed using, e.g., aluminum. At this point the cell is complete and is operational; however, in order to protect it from the elements the following further processing is performed. The front side is protected by an optional layer of resin film 1015, e.g., ethylene vinyl acetate, followed by glass 1045. The backside may also be protected using a resin film 1035, followed by glass or other protective coating 1040.

As shown in FIGS. 9A and 9B, the embodiments discussed above may be employed to manufacture the SmartSi wafers, which may be further processed to manufacture the SmartSi solar cell. According to another aspect of the invention, a SmartSi solar cell may be processed further to manufacture a multi-junction SmartSi solar cell with multiple band gaps in order to enhance the photovoltaic conversion efficiency. An embodiment of a multi-junction SmartSi solar cell is illustrated in FIG. 11A. In FIG. 11A, a metallurgical grade silicon substrate 1100 is doped p-type. The top surface of the p-type substrate is passivated with a thin layer 1105 of intrinsic amorphous silicon having hydrogen atoms dispersed therein and occupying silicon dangling bonds. This is sometimes referred to as hydrogenated silicon. A layer of thin n-type amorphous hydrogenated silicon, 1110, is formed over the intrinsic layer 1105, to thereby form the first p-i-n junction, as is shown in the SmartSi solar cell embodiment described above. The intrinsic and n-type layers 1105 and 1110 are relatively much thinner than typical thin-film layers of a conventional thin-film solar cell, as in this embodiment the first thin film structure need not function as light absorbent, rather the light is absorbed in the metallurgical silicon substrate.

To increase the conversion efficiency of the SmartSi solar cell, a conventional thin film solar cell p-i-n structure is now formed on top of the SmartSi solar cell. First, a thin-film p-type amorphous hydrogenated silicon layer 1120 is formed over the SmartSi solar cell. Then a thin-film intrinsic amorphous hydrogenated silicon layer 1125 is formed over the p-type layer 1120 and a thin-film n-type amorphous hydrogenated silicon layer 1130 is formed over the intrinsic layer 1125. The intrinsic layer 1125 functions as another light absorber and generates electron-hole pairs to thereby convert light to electrical energy. To collect the electrical energy a top transparent electrode ITO 1135 is formed over the n-type layer 1130, and then metallic contacts 1140 are formed over the ITO 1135. Here the metallic contacts 1140 are made of silver, e.g. using silver paste and then sintering the structure to form good ohmic contact. Additionally, a metallic electrode 1145 is formed at the bottom of the substrate 1100. Here contacts 1145 are made of aluminum. FIG. 11B illustrates a similar multi-junction structure, except that the polarity of the layers is reversed.

Figures 12A, 12B:
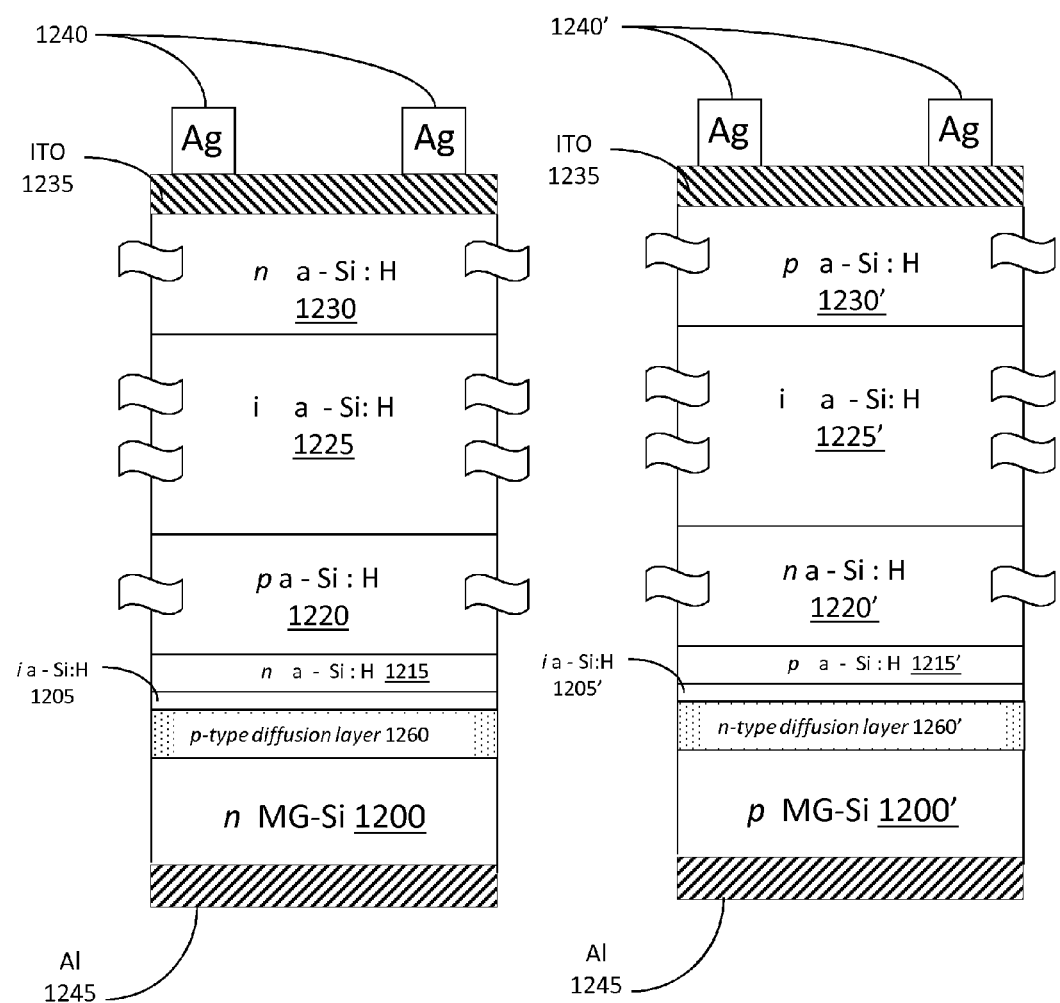
FIGS. 12A and 12B illustrate embodiments for multi-junction SmartSi solar cells with diffusion junction.

FIGS. 12A and 12B illustrate embodiments for multi-junction SmartSi solar cells with diffusion junction. The embodiments of FIGS. 12A and 12B are basically the same, except that the polarity of the layers is reverse. Therefore, the description proceeds only with respect to one of them, i.e., the embodiment of FIG. 12A. In FIG. 12A, a metallurgical silicon substrate 1200 is made according to the embodiments described above, and is doped n-type. Then, the top layer of the substrate is diffused to form a p-type diffusion layer 1260. This forms a p-n junction within the metallurgical silicon substrate and provides a conversion region of the solar cell, similar to standard silicon-based solar cell. Then a thin passivation layer 1205 of intrinsic amorphous hydrogenated silicon is formed on top of the diffused p-type layer. An n-type amorphous hydrogenated silicon layer 1215 is formed over the intrinsic layer 1205, so that layers 1215, 1205 and 1260 form a p-i-n junction having a different band gap than the p-n junction within the substrate 1200 and therefore absorbing light at different frequencies. Then a conventional thin-film p-i-n junction is formed on top of layer 1215 by forming a p-type amorphous hydrogenated silicon layer 1220, intrinsic amorphous hydrogenated silicon layer 1225 and n-type amorphous hydrogenated silicon layer 1230. In this structure the intrinsic layer 1225 is of much higher thickness than intrinsic layer 1205, as it functions as a light absorber. Also, the thin-film p-i-n structure has a different band gap than the structures below it and therefore absorbs light in different frequencies. Therefore, by carefully selecting the thickness of the layers, one can "tune" the structure to absorb light at a wide range of frequencies.

FIGS. 13A and 13B illustrate embodiments of symmetrical arrangement of metallurgical Silicon substrate sandwiched between intrinsic-Si/doped-Si:H thin films on both sides. FIGS. 13A and 13B are mirror image of each other, except that the polarities of the layers are reversed. Accordingly only FIG. 13A is explained. In FIG. 13A, a p-type metallurgical silicon substrate 700 has a top intrinsic layer 705 and a bottom intrinsic layer 730, both of which act as passivation layers rather than absorbers. Then a thin layer of n-type amorphous hydrogenated silicon 710 is formed on top of the intrinsic layer 705, and another n-type layer 735 is formed over intrinsic layer 730. The contacts 720 and 725 are then formed as described with respect to other embodiments.

Figures 14, 15:
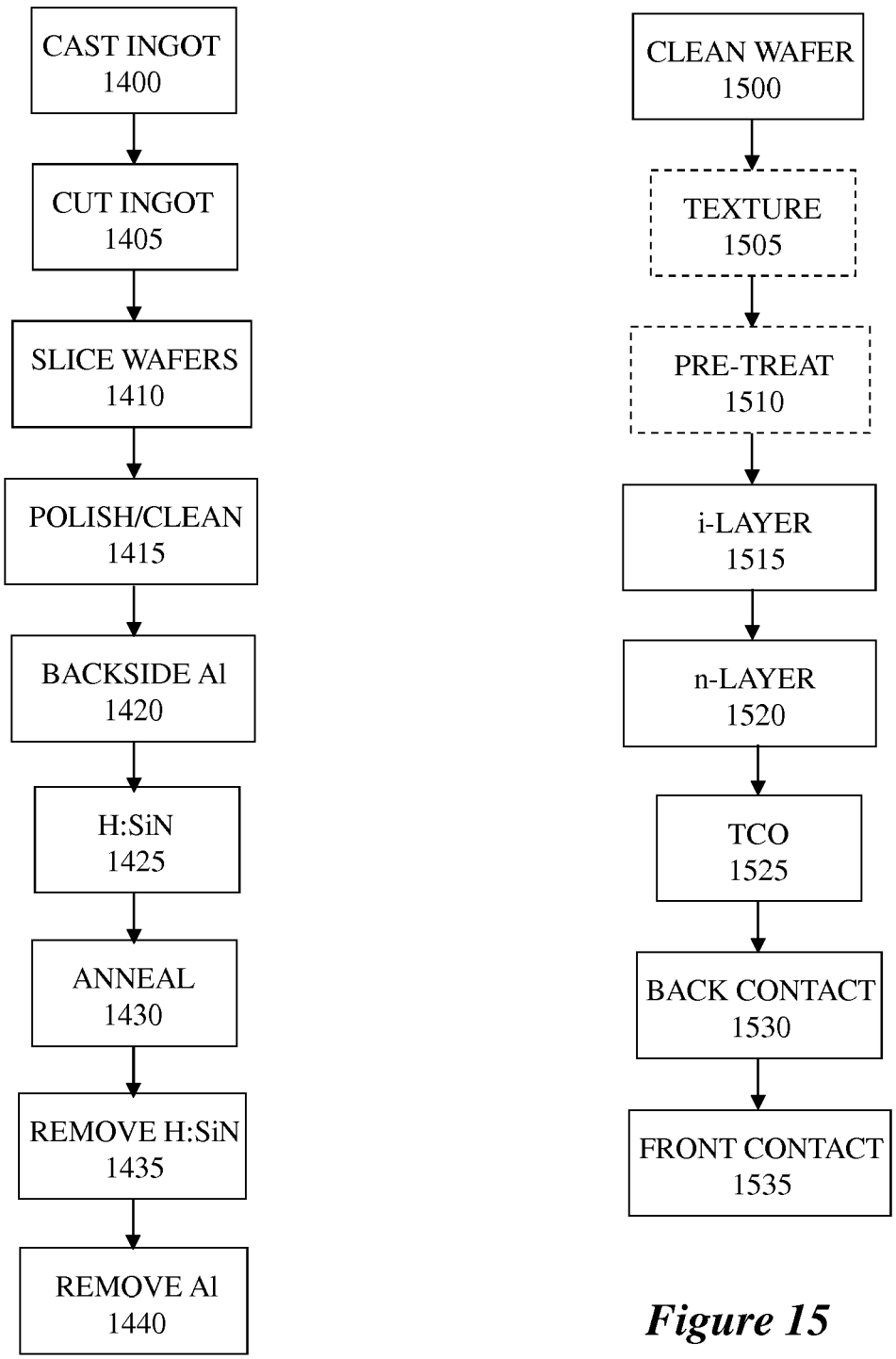
FIG. 14 illustrates an alternative metallurgical silicon wafer preparation according to an embodiment of the invention.
FIG. 15 illustrates an alternative fabrication of a solar cell using metallurgical silicon wafers according to an embodiment of the invention.

FIG. 14 illustrates an alternative metallurgical silicon wafer preparation according to an embodiment of the invention. In step 1400 metallurgical silicon pellets or power are/is melted and let solidify into an ingot. In this process the cooling rate and temperature gradient is controlled in horizontal direction so as to cause impurities to move to the surface of the cylinder and in the vertical direction to cause the impurities to concentrate at the silicon grain boundaries. Optionally, the solidified cylinder is re-melted and then solidified in sections, so as to move impurities to one side of the cylinder. At step 1405 the solidified ingot is sawed into the desired cylinder shape (square or round), such that the extremities, which contain much of the impurities, are removed. At step 1410 the cylinder is sawed into wafers. At step 1415 each wafer is polished and cleaned as needed. At step 1420 an aluminum layer is deposited on the backside of each wafer using, e.g., a PVD process. In step 1425 a H;SiN layer is deposited on the front side of each wafer using, e.g., a PECVD process. At step 1430 the wafers are annealed at, e.g., 700° C. In this step, a large amount of hydrogen is driven into the wafer, and the aluminum layer ensures capturing the hydrogen inside the wafer. In step 1435 the H:SiN layer is removed using, e.g., wet etching, and in step 1440 the Al layer is removed using, e.g., wet etching as well.

FIG. 15 illustrates an alternative fabrication of a solar cell using metallurgical silicon wafers according to an embodiment of the invention. In step 1500 the metallurgical silicon wafer, e.g., a wafer obtained using the processes shown in FIG. 14, is cleaned using, e.g., a wet bench process. In optional step 1505 the top surface of the wafer is textured. Texturing can be done by wet or dry etching using processes that cause preferential etching at grain boundaries or of specific crystal orientations, such as where the atomic density is lower, e.g. (100) face etches faster than (111) or (211). Accordingly there will be faceted grains whose surfaces are predominantly (111) and grooved grain boundaries. The result is a lower reflectivity of the surface, resulting in more of the incoming light being absorbed to create electron-hole pairs within the metallurgical silicon. This can also be done by repeated oxidizing of the front surface followed by repeated etching of the native oxide after each oxidizing step. Such a process would cause preferential etching at grain boundaries, leading to texturing of the surface. Texturing of the surface can assist in internal light reflection for enhanced light absorbency by the solar cell. The optional texturing step may be followed by soft etch so as to remove sharp edges caused by the texturing in order to improve coverage of the next deposited layer and to avoid puncturing the next layer. In step 1515 an intrinsic silicon layer is deposited on the front surface using, e.g., PECVD process. If needed, a pre-treatment process can be performed at step 1510, so as to remove any native oxide layer prior to depositing the i-layer. At step 1520 an n-layer is deposited over the i-layer using, e.g., PECVD process. At step 1525 a TCO layer e.g., an ITO) is deposited over the n-layer using, e.g., a PVD process. At step 1530 a back contact layer is deposited using, e.g., PVD process. At step 1535 a front contact layer is formed over the TCO layer using, e.g., a printing process.

Figure 16A:
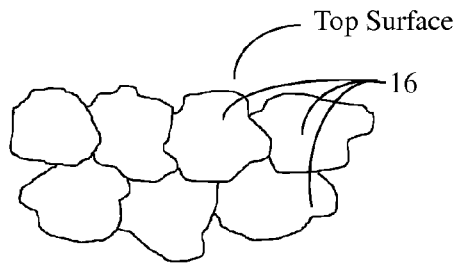
FIGS. 16A-16F illustrate a method for texturing and conditioning the surface of a substrate according to an embodiment of the invention.
Figure 16F:
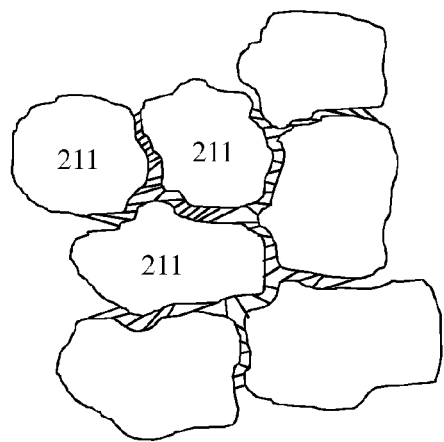
Figure 16B:
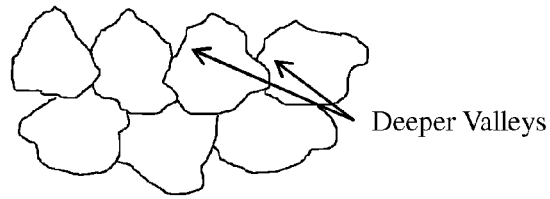
Figure 16C:
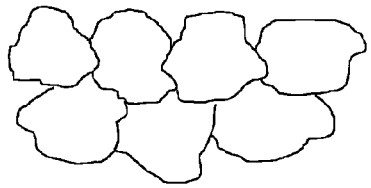
Figure 16D:
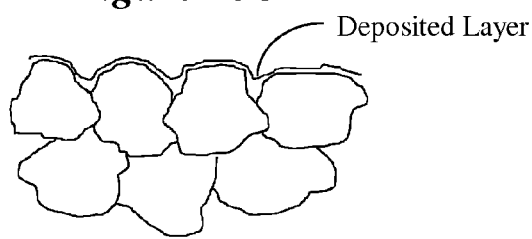
Figure 16E:
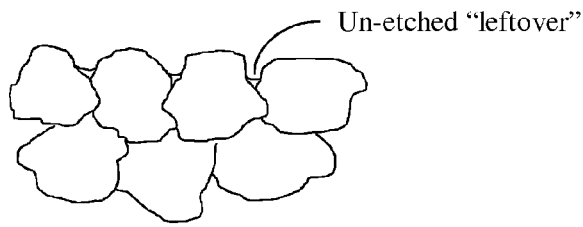

FIGS. 16A-16F illustrate a method for texturing and conditioning the surface of a substrate according to an embodiment of the invention. FIGS. 16A-16E are cross section of an enlarged part of the substrate showing the grains at the top surface of the substrate, while FIG. 16F is a top view of the top surface after texturing and conditioning has been completed. FIG. 16A illustrate a cross section at the top surface of the substrate prior to the texturing procedure. This can be, for example, after step 1440 in FIG. 14. The substrate then undergoes texturing using, for example, wet etch procedure. The following process can be used as an example of texturing using wet etch: dip substrate into an HF+(nitric) $HNO_3$ solution; rinse substrate; dip substrate in KOH or NaOH solution; rinse substrate; dip substrate in HF+HCL solution; rinse substrate; dry substrate. After this wet process the top surface becomes more rugged, with sharper peaks and deeper valleys, due in part to preferential etching at the grains boundaries. This condition is illustrated in the cross section of FIG. 16B. The substrate may then undergo a light etch treatment, e.g., dry etch, so as to remove the sharp peaks on the surface. The result is shown in FIG. 16C. Then a thin layer of SiO2 or Si is deposited on the surface. As shown in FIG. 16D, the deep valleys naturally get preferentially deposited, such that the deep valleys are covered with SiO2. The substrate then undergoes another etch process to remove the deposited SiO2 or Si. However, as shown in FIG. 16E, the deposited SiO2 or Si remains at the grain boundaries. This condition is shown from a top view in FIG. 16F. Most of the grains of the SG substrate have a 211 orientation. Thus, employing the above process essentially eliminates the grain boundaries, resulting in essentially a 2-dimensional "discontinuous" crystal constituted of grains having substantially the same orientation and the defects of the grain boundaries being "masked" or neutralized by the SiO2 layer that remains after the etch treatment.

FIGS. 17A-17E illustrate an alternative method for texturing and conditioning the surface of a substrate according to an embodiment of the invention. The method assists in neutralizing the effects of defects at the grain boundaries of multi-grain substrates. This process may be especially effective when using metallurgical grade silicon as substrates for devices such as, for example, solar cells or LED's.

Figure 17A:
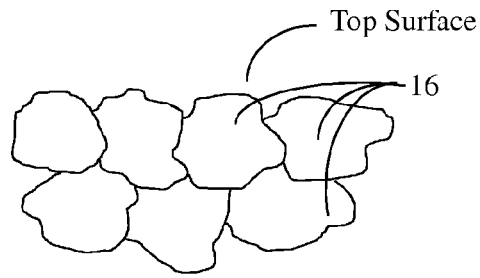
FIGS. 17A-17E illustrate an alternative method for texturing and conditioning the surface of a substrate according to an embodiment of the invention.
Figure 17B:
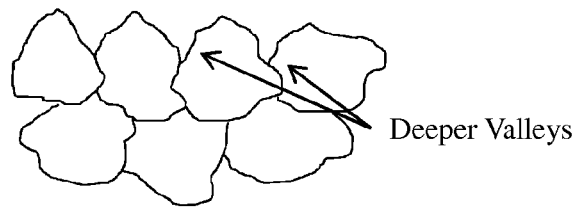
Figure 17C:
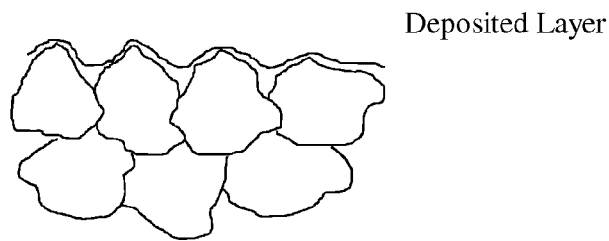
Figure 17D:
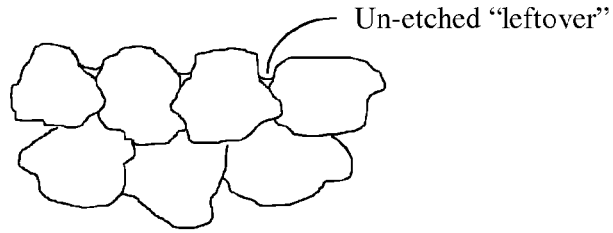
Figure 17E:
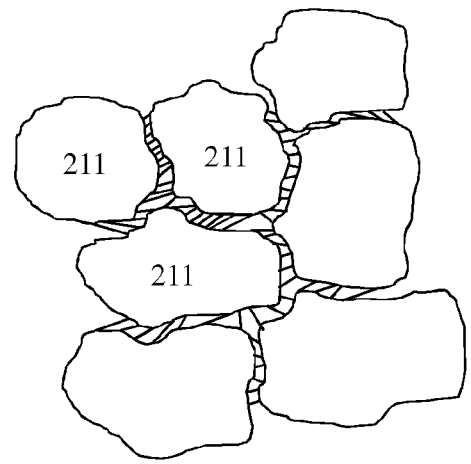

FIGS. 17A-17D are cross section of an enlarged portion of the substrate showing the grains at the top surface of the substrate, while FIG. 17E is a top view of the top surface after texturing and conditioning has been completed. FIG. 17A illustrate a cross section at the top surface of the substrate prior to the texturing procedure. This can be, for example, after step 1440 in FIG. 14. The substrate then undergoes texturing using, for example, wet etch procedure. The following process can be used as an example of texturing using wet etch: dip substrate into an HF+(nitric) $HNO_3$ solution; rinse substrate; dip substrate in KOH or NaOH solution; rinse substrate; dip substrate in HF+HCL solution; rinse substrate; dry substrate. After this wet process the top surface becomes more rugged, with sharper peaks and deeper valleys, due in part to preferential etching at the grains boundaries. This condition is illustrated in the cross section of FIG. 17B. Then a thin layer of SiO2 or Si is deposited on the surface. As shown in FIG. 17C, the deep valleys naturally get preferentially deposited, such that the deep valleys are covered with SiO2 or Si. The substrate then undergoes an etch process to remove the deposited SiO2 or Si. This etch treatment, e.g., dry etch, removes the deposited layer from most of the top surface and may also remove some of the sharp peaks of the grains on the surface. However, as shown in FIG. 17D, the deposited SiO2 or Si remains at the deep valleys at the grain boundaries. This condition is shown from a top view in FIG. 17E. Most of the grains of the SG substrate have a (211) orientation. Thus, employing the above process essentially eliminates the grain boundaries, resulting in essentially a 2-dimensional "discontinuous" crystal constituted of grains having substantially the same orientation and the defects of the grain boundaries being "masked" or neutralized by the SiO2 layer that remains after the etch treatment.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:
1. A solar cell comprising:
 a doped metallurgical grade silicon substrate, having 99.9 to 99.999 percent purity, having a back surface and a front textured surface and having a SiO2 or Si passivation at grain boundaries of the front textured surface;
a contact layer formed on the back layer;
a thin film structure formed over and in direct contact with the front textured surface; wherein the thin film structure comprises an intrinsic amorphous silicon layer formed over and in direct contact with the front textured surface;
a front metallization layer formed over the thin film structure.

2. The solar cell of claim 1, wherein the thin film structure comprises:
a silicon layer, of opposite doping as the substrate, formed over and in direct contact with the intrinsic amorphous silicon layer.

3. The solar cell of claim 2, wherein the substrate is hydrogenated.

4. The solar cell of claim 2, wherein the contact layer comprises a sputtered aluminum.

5. The solar cell of claim 1, wherein the substrate is doped p-type and has a resistivity of about 1 ohm-cm.

6. The solar cell of claim 5, wherein the substrate contains both boron and phosphorous dopants.

7. The solar cell of claim 1, wherein the front textured surface comprises a dry etched surface.

8. The solar cell of claim 2, wherein both the layer of intrinsic amorphous silicon and the silicon layer, of opposite doping as the substrate, are hydrogenated.

9. The solar cell of claim 2, wherein the substrate is doped p-type and the silicon layer, of opposite doping as the substrate, is doped n-type.

* * * * *